(12) United States Patent
Lee et al.

(10) Patent No.: US 11,094,558 B2
(45) Date of Patent: Aug. 17, 2021

(54) DOPED METAL-CHALCOGENIDE THIN FILM AND METHOD OF MANUFACTURING THE SAME

(71) Applicant: Research & Business Foundation Sungkyunkwan University, Suwon-si (KR)

(72) Inventors: Changgu Lee, Seoul (KR); Youngchan Kim, Bucheon-si (KR); Hunyoung Bark, Suwon-si (KR)

(73) Assignee: Research and Business Foundation Sungkyunkwan University, Suwon-si (KR)

( * ) Notice: Subject to any disclaimer, the term of this patent is extended or adjusted under 35 U.S.C. 154(b) by 0 days.

(21) Appl. No.: 16/681,057

(22) Filed: Nov. 12, 2019

(65) Prior Publication Data

US 2020/0152477 A1    May 14, 2020

(30) Foreign Application Priority Data

Nov. 14, 2018   (KR) ........................ 10-2018-0140227

(51) Int. Cl.
*H01L 21/00* (2006.01)
*H01L 21/385* (2006.01)
*H01L 21/477* (2006.01)
*H01L 29/24* (2006.01)
*H01L 21/02* (2006.01)

(52) U.S. Cl.
CPC ...... *H01L 21/385* (2013.01); *H01L 21/02568* (2013.01); *H01L 21/477* (2013.01); *H01L 29/24* (2013.01)

(58) Field of Classification Search
None
See application file for complete search history.

(56) References Cited

U.S. PATENT DOCUMENTS

| 3,975,189 A * | 8/1976 | Haugen ............... C22B 15/0093 |
| | | 205/589 |
| 8,294,265 B1 * | 10/2012 | Oh ......................... H01L 24/11 |
| | | 257/737 |
| 2001/0046609 A1 * | 11/2001 | Namikawa ............ H01L 21/385 |
| | | 428/651 |
| 2002/0123248 A1 | 9/2002 | Moore et al. |
| 2006/0043380 A1 * | 3/2006 | Hiroshi ............... H01L 33/0041 |
| | | 257/79 |
| 2017/0051400 A1 * | 2/2017 | Choi ...................... H01L 21/20 |

FOREIGN PATENT DOCUMENTS

| KR | 10-1465211 B1 | 11/2014 |
| KR | 10-2015-0129485 A | 11/2015 |

OTHER PUBLICATIONS

Korean Office Action dated Nov. 7, 2019 in corresponding Korean Patent Application No. 10-2018-0140227 (6 pages in Korean).

* cited by examiner

*Primary Examiner* — Reema Patel
(74) *Attorney, Agent, or Firm* — NSIP Law (57) ABSTRACT

A method of manufacturing a doped metal chalcogenide thin film includes depositing a dopant atom on a base material; and forming a doped metal chalcogenide thin film on the dopant atom-deposited base material by supplying heat and a reaction gas comprising a metal precursor and a chalcogen precursor to the dopant atom-deposited base material.

14 Claims, 12 Drawing Sheets

DOPED METAL-CHALCOGENIDE THIN FILM AND METHOD OF MANUFACTURING THE SAME

CROSS-REFERENCE TO RELATED APPLICATIONS

This application claims the benefit under 35 USC 119(a) of Korean Patent Application No. 10-2018-0140227 filed on Nov. 14, 2018, in the Korean Intellectual Property Office, the entire disclosure of which is incorporated herein by reference for all purposes.

BACKGROUND

1. Field

The present disclosure relates to doped metal chalcogenide thin film and method of manufacturing the same, and an element including the doped metal chalcogenide thin film.

2. Description of the Related Art

Five elements, oxygen (O), sulfur (S), selenium (Se), tellurium (Te), and polonium (Po), among elements belonging to Group 16 in the periodic table are called as oxygen group elements. Three elements of the group, sulfur, selenium, and tellurium, are called sulfur group elements or chalcogens.

Although oxygen and sulfur are typical nonmetallic elements, other elements besides oxygen and sulfur have increased metallicity while losing non-metallicity according to an increase in atomic number. Selenium, tellurium, and polonium are rare elements, and polonium is a naturally radioactive element.

A metal chalcogenide as a compound of transition metal and chalcogen is a nanomaterial having a structure similar to that of graphene. Since the thickness of the metal chalcogenide, as thickness of several atomic layers, is very thin, the metal chalcogenide has flexible and transparent characteristics and exhibits electrically various properties of a semiconductor, a conductor, etc.

Particularly, since a metal chalcogenide with semiconductor properties exhibits electron mobility of several hundred $cm^2/V \cdot s$, while having an appropriate band gap, the metal chalcogenide may be suitable as a semiconductor element with great potential in flexible transistors.

$MoS_2$, $WS_2$, and others among metal chalcogenide materials, which have most actively been researched have a direct band gap in a monolayer state. Therefore, since efficient light absorption may occur in $MoS_2$, $WS_2$ and others, $MoS_2$, $WS_2$, and others are suitable for application of optical elements including an optical sensor, a solar cell, etc.

A method of manufacturing such a metal chalcogenide thin film has recently actively been researched. However, characteristics for which such a metal chalcogenide thin film is applied as the above-mentioned element, i.e., a method and the like which are capable of uniformly and continuously synthesizing a thin film in a large area are required.

Korean Patent Registration No. 10-1465211 relates to a method of manufacturing a doped metal chalcogenide thin film. Specifically, although the above-mentioned registered patent discloses a method of manufacturing a metal chalcogenide thin film by depositing a dopant and a metal precursor together, a method and the like of increasing the particle size of metal chalcogenide have not been recognized in the above-mentioned registered patent.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method of manufacturing a doped metal chalcogenide thin film includes depositing a dopant atom on a base material; and forming a doped metal chalcogenide thin film on the dopant atom-deposited base material by supplying heat and a reaction gas comprising a metal precursor and a chalcogen precursor to the dopant atom-deposited base material.

The forming of the doped metal chalcogenide thin film may include continuously performing a first heat treatment process and a second heat treatment process.

The first heat treatment process may include synthesis of the metal chalcogenide thin film for a predetermined period, and the second heat treatment process may include increasing crystallinity of the metal chalcogenide thin film.

The reaction gas may be Hydrogen Sulfide.

The predetermined period may be about 20 to 40 minutes.

The first heat treatment process may be performed in a temperature range of about 100 to 600° C., and the second heat treatment process may be performed in a temperature range of about 600 to 900° C.

The doped metal chalcogenide thin film may have a particle size of about 100 to 900 nm.

The doped metal chalcogenide thin film may exhibit N-type semiconductor properties or P-type semiconductor properties.

The dopant atom may include a material selected from the group consisting of Nb, Mn, Ti, W, Zr, Mg, P, Ni, Al, Sn, V, Re, Ge, Si, B, Ga, In, Sb, Cr, Au, Na, Li, and combinations thereof.

The depositing the dopant atom on the base material may be performed by a method selected from the group consisting of an electron beam evaporation method, a sputtering method, a vacuum deposition method, an ion plating method, a thermal evaporation method, an ion cluster beam method, a pulsed laser deposition method, an atomic layer deposition method, an atomic beam epitaxy method, and combinations thereof.

The metal precursor may include a material selected from the group consisting of Mo, W, Bi, Mg, Al, Si, Ca, Sc, Ti, V, Cr, Mn, Fe, Co, Ni, Cu, Zn, Ga, Ge, Sr, Y, Zr, Nb, Tc, Ru, Rh, Pd, Ag, Cd, In, Sn, Sb, Ba, La, Hf, Ta, Re, Os, Ir, Pt, Au, Hg, Tl, Pb, Po, oxides thereof, and combinations thereof.

The metal precursor may be prepared by sublimating a metal precursor that is solid.

The chalcogen precursor may include a material selected from the group consisting of S, Se, Te, and combinations thereof.

The base material may include a material selected from the group consisting of Si, $SiO_2$, Ge, GaN, AlN, GaP, InP, GaAs, SiC, Al$_2$O$_3$, LiAlO$_3$, MgO, glass, quartz, sapphire, graphite, graphene, plastics, polymer, boron nitride (h-BN), and combinations thereof.

A doped metal chalcogenide thin film manufactured by the method disclosed above.

The doped metal chalcogenide thin film may have a particle size of about 100 to 900 nm.

A thin film may include the doped metal chalcogenide thin film.

In another general aspect, a doped metal chalcogenide thin film includes a dopant atom on a base material, and a doped metal chalcogenide thin film disposed on the dopant atom-deposited base material. The doped metal chalcogenide thin film has a charge mobility of about 0.1 cm$^2$/V·s.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure.

The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

When unique manufacture and material allowable errors of numerical values are suggested to mentioned meanings of terms of degrees used in the present disclosure such as "about", "substantially", etc., the terms of degrees are used as the numerical values or as a meaning near the numerical values, and the terms of degrees are used to prevent that an unscrupulous infringer unfairly uses a disclosure content in which extract or absolute numerical values are mentioned to help understanding of the present disclosure. Further, in the whole present specification, "a step doing ~" or "a step of ~" does not mean "a step for ~".

In the whole present specification, a term of "a combination thereof" included in a Markush type expression, which means a mixture or combination of one or more selected from the group consisting of elements described in the Markush type expression, means including one or more selected from the group consisting of the elements.

Hereinafter, a method of manufacturing a doped metal chalcogenide thin film according to the present disclosure, a doped metal chalcogenide thin film manufactured by the method, and an element including the doped metal chalcogenide thin film will be described in specifically with reference to embodiments, examples and drawings. However, the present disclosure is not limited to such embodiments, examples and drawings.

As a technical means for achieving the above-mentioned technical object, a first aspect of the present disclosure provides a method of manufacturing a doped metal chalcogenide thin film, the method includes: depositing a dopant atom on a base material; and forming a doped metal chalcogenide thin film on the dopant atom-deposited base material by supplying a reaction gas including a metal precursor and a chalcogen precursor, and heat to a dopant atom-deposited base material.

Figure 1:
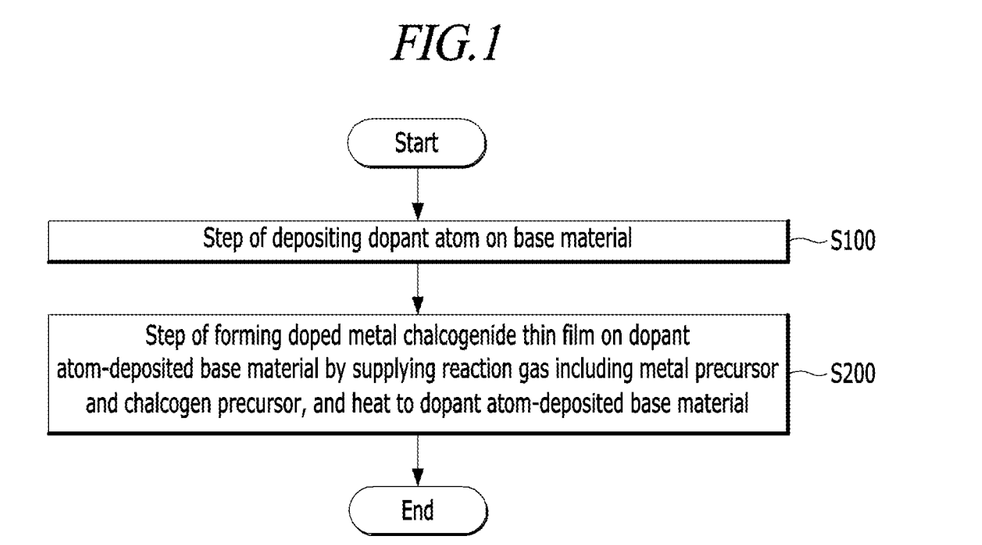
FIG. 1 is a flowchart illustrating a method of an example of manufacturing a doped metal chalcogenide thin film.
Figure 2:
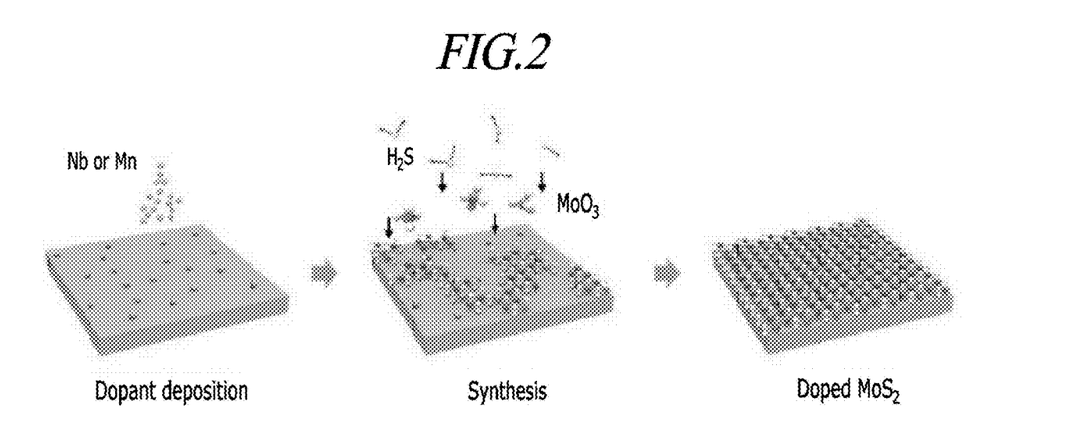
FIG. 2 is a schematic diagram schematically illustrating a method of an example of manufacturing a doped metal chalcogenide thin film.

FIG. 1 is a flowchart illustrating a method of an example of manufacturing a doped metal chalcogenide thin film. FIG. 2 is a schematic diagram schematically illustrating an example of a method of manufacturing a doped metal chalcogenide thin film. Hereinafter, the method of manufacturing the doped metal chalcogenide thin film will be described with reference to FIG. 1 and FIG. 2.

First, a dopant atom is deposited on a base material (S100).

In an example, the base material may include material selected from the group consisting of Si, $SiO_2$, Ge, GaN, AlN, GaP, InP, GaAs, SiC, $Al_2O_3$, $LiAlO_3$, MgO, glass, quartz, sapphire, graphite, graphene, plastics, polymer, boron nitride (h-BN), and combinations thereof.

In an example, the dopant atom may include material selected from the group consisting of Nb, Mn, Ti, W, Zr, Mg, P, Ni, Al, Sn, V, Re, Ge, Si, B, Ga, In, Sb, Cr, Au, Na, Li, and combinations thereof. In one example, the dopant atom may include a material selected from the group consisting of Nb, Mn, and a combination thereof.

In an example, the doped metal chalcogenide thin film may exhibit N-type semiconductor properties or P-type semiconductor properties. Specifically, the doped metal chalcogenide thin film may exhibit the P-type semiconductor properties when the dopant atom is Nb, and the doped metal chalcogenide thin film may exhibit the N-type semiconductor properties when the dopant atom is Mn.

In an example, the depositing a dopant atom on a base material may be performed by a method selected from the group consisting of an electron beam evaporation method, a sputtering method, a vacuum deposition method, an ion plating method, a thermal evaporation method, an ion cluster beam method, a pulsed laser deposition method, an atomic layer deposition method, an atomic beam epitaxy method, and combinations thereof. In one example, the dopant atom can be deposited on the base material using the electron beam evaporation method.

Subsequently, a doped metal chalcogenide thin film is formed on the dopant atom-deposited base material by supplying a reaction gas including a metal precursor and a chalcogen precursor, and heat to a dopant atom-deposited base material (S200).

In an example, the reaction gas may be Hydrogen Sulfide ($H_2S$).

In an example, the metal precursor may include material selected from the group consisting of Mo, W, Bi, Mg, Al, Si, Ca, Sc, Ti, V, Cr, Mn, Fe, Co, Ni, Cu, Zn, Ga, Ge, Sr, Y, Zr, Nb, Tc, Ru, Rh, Pd, Ag, Cd, In, Sn, Sb, Ba, La, Hf, Ta, Re, Os, Ir, Pt, Au, Hg, Tl, Pb, Po, oxides thereof, and combinations thereof. In one example, the metal precursor may include Mo.

In an example, the metal precursor may be prepared by sublimating a metal precursor that is solid. When the metal precursor that is solid is sublimated within a CVD chamber, larger metal chalcogenide particles can be formed by allowing the growth of a thin film to be started at a partial position on the base material.

In an example, the chalcogen precursor may include a material selected from the group consisting of S, Se, Te, and combinations thereof. In one example, the chalcogen precursor may include S.

In an example, the forming the doped metal chalcogenide thin film may include continuously performing a first heat treatment process and a second heat treatment process.

In an example, the first heat treatment process may include continuing synthesis of the metal chalcogenide thin film for a predetermined period of time, and the second heat treatment process may include increasing the crystallinity of the metal chalcogenide thin film.

Figure 3:
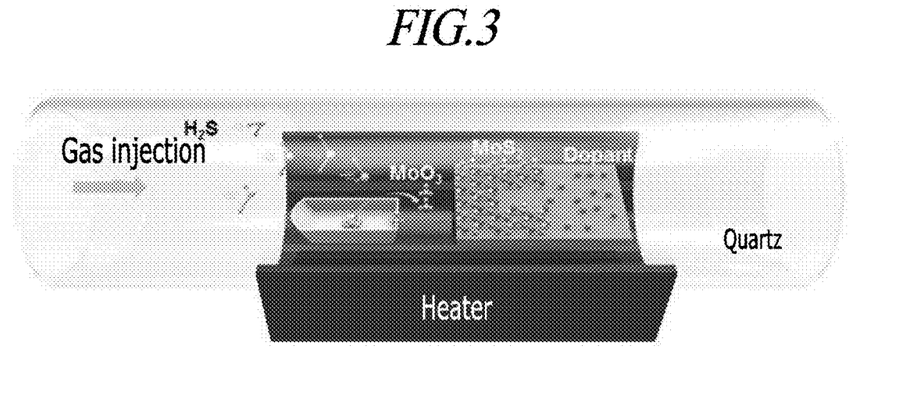
FIG. 3 is a schematic diagram schematically illustrating an example of a synthesis of the metal chalcogenide thin film in the first heat treatment process of a method of manufacturing a doped metal chalcogenide thin film.
Figure 4:
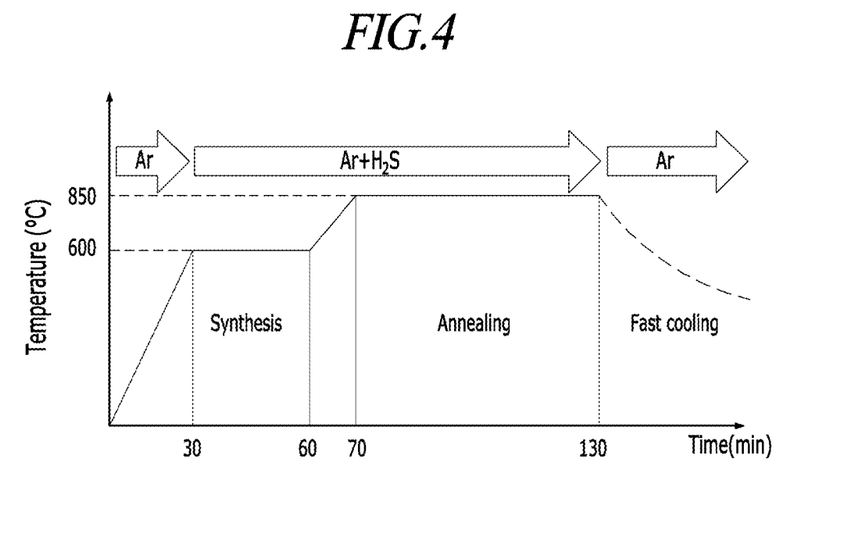
FIG. 4 is a schematic diagram schematically illustrating an example of a first heat treatment process and a second heat treatment process of a method of manufacturing a doped metal chalcogenide thin film.

FIG. 3 is a schematic diagram schematically illustrating an example synthesis of the metal chalcogenide thin film in the first heat treatment process of a method of manufacturing a doped metal chalcogenide thin film. FIG. 4 is a schematic diagram schematically illustrating an example of the first heat treatment process and the second heat treatment process of a method of manufacturing a doped metal chalcogenide thin film.

Specifically, synthesis may be performed by reacting the metal precursor and the chalcogen precursor on the dopant atom-deposited base material in the first heat treatment process. The crystallinity of a doped metal chalcogenide thin film is increased in the second heat treatment process.

In an example, the first heat treatment process may be performed in a temperature range of about 100 to about 600° C., and the second heat treatment process may be performed in a temperature range of about 600 to about 900° C.

For example, the first heat treatment process may be performed in a temperature range of about 100 to about 600° C., about 100 to about 500° C., about 100 to about 400° C., about 100 to about 300° C., about 100 to about 200° C., about 200 to about 600° C., about 300 to about 600° C., about 400 to about 600° C., or about 500 to about 600° C.

For example, the second heat treatment process may be performed in a temperature range of about 600 to about 900° C., about 600 to about 800° C., about 600 to about 700° C., about 700 to about 900° C., or about 800 to about 900° C.

In an example, the first heat treatment process may be performed for about 20 to 40 minutes, and the second heat treatment process may be performed for about 50 to 70 minutes.

In an example, the doped metal chalcogenide thin film may have a particle size of about 100 to about 900 nm.

When manufacturing the doped metal chalcogenide thin film by a conventional method of depositing a dopant and a metal precursor together, the particle size of the metal chalcogenide is limited to several tens of nanometers since the metal chalcogenide is grown at all points on the base material, thereby making it difficult to form particles with a large particle size.

In the examples of the present disclosure, metal chalcogenide particles with a large particle size can be formed since the metal precursor and the chalcogen precursor are grown at partial positions on the base material when manufacturing the doped metal chalcogenide thin film. Hereinafter, a doped metal chalcogenide thin film according to the present disclosure will be specifically described with reference to FIG. 5A and FIG. 5B in an Experimental Example.

Further, the charge mobility of the doped metal chalcogenide thin film according to the present disclosure may be improved 100 times or more by increasing a particle size of a doped metal chalcogenide thin film in the present disclosure several hundred times when compared to doped metal chalcogenide thin films of Comparative Examples. Accordingly, the method of manufacturing a doped metal chalcogenide thin film in the present disclosure may manufacture an element with more excellent performance characteristics by improving the optical reaction characteristics when compared to the doped metal chalcogenide thin films of Comparative Examples.

A second aspect of the present disclosure provides a doped metal chalcogenide thin film manufactured by the method based on the first aspect. Detailed descriptions have been omitted with respect to parts of the second aspect overlapped with those of the first aspect. However, contents of descriptions described for the first aspect may be equally applied, although the descriptions have been omitted in the second aspect.

In an example, the doped metal chalcogenide thin film may have a particle size of about 100 to about 900 nm.

A third aspect of the present disclosure provides an element that includes the doped metal chalcogenide thin film of the second aspect. Detailed descriptions have been omitted with respect to parts of the third aspect overlapped with those of the second aspect. However, contents of descriptions described for the second aspect may be equally applied, although the descriptions have been omitted in the third aspect.

An element including the doped metal chalcogenide thin film of the present disclosure may be applied to all electronic circuits and electronic devices. For example, a field effect transistor, an optical sensor, a light emitting element, an optical detector, an optical magnetic memory element, a photo catalyst, a flat panel display, a flexible element, a solar cell, and others can be manufactured using the element.

Hereinafter, the present disclosure will be described in more detail through Examples, but the Examples are only for the purpose of describing the present disclosure, and the scope of the present disclosure is not limited thereto.

Example

After sonicating a $SiO_2$/Si base material with a thickness of 300 nm for 10 minutes in each of acetone and isopropyl alcohol (IPA), thereby cleaning the $SiO_2$/Si base material before depositing a dopant on a cleaned $SiO_2$/Si base material, the cleaned $SiO_2$/Si base material was rinsed with deionized water several times. Nb (P-type) or Mn (N-type) metal with a thickness of 0.5 nm was deposited on the $SiO_2$/Si base material by the electron beam evaporation method.

Subsequently, a wafer-scale single-layer $MoS_2$ was synthesized in a customized CVD chamber of a low-pressure state of up to $10^{-3}$ Torr. In order to synthesize $MoS_2$, a 5 mg $MoO_3$ (≥99.999%, Sigma-Aldrich) mass in a quartz boat was put in the center of a furnace, and the $SiO_2$/Si base material was put in the downstream of a $MoO_3$ powder. In the synthesis process, flow rate of Ar gas was 200 standard cubic centimeters per minute (sccm), and flow rate of $H_2S$ was 1 sccm.

Comparative Example 1

A pure $MoS_2$ thin film of Comparative Example 1 was manufactured by the same method as in the Example, and deposition of Nb or Mn metal of the Example was omitted.

Comparative Example 2

Mo metal was deposited to thickness values of 0.5 nm, 1 nm, 2 nm and 3 nm on a Si/$SiO_2$ base material by the electron beam evaporation method. Subsequently, after injecting an $H_2S$ gas with a temperature of about 750° C. into a quartz tube in a low vacuum state for 1 hour, and rapidly cooling the $H_2S$ gas injected into the quartz tube in an argon atmosphere, a doped $MoS_2$ thin film was formed.

Experimental Example

Figure 5A:
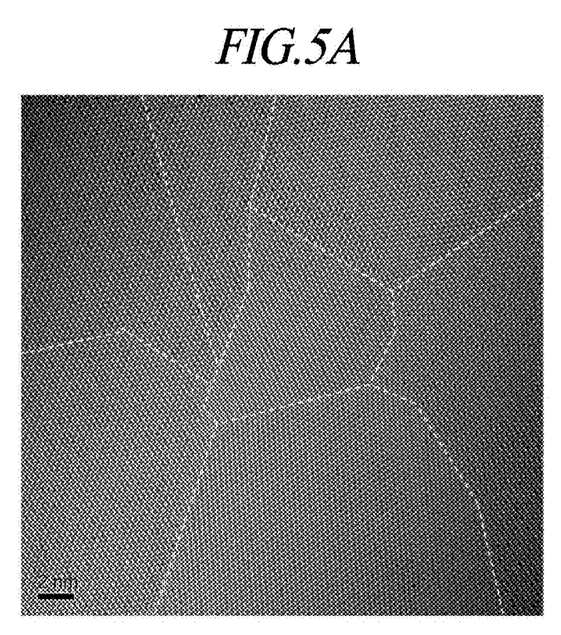
FIG. 5A and FIG. 5B depict examples of a transmission electron microscope (TEM) image illustrating doped metal chalcogenide thin films of a Comparative Example and an Example of the present disclosure, respectively.
Figure 5B:
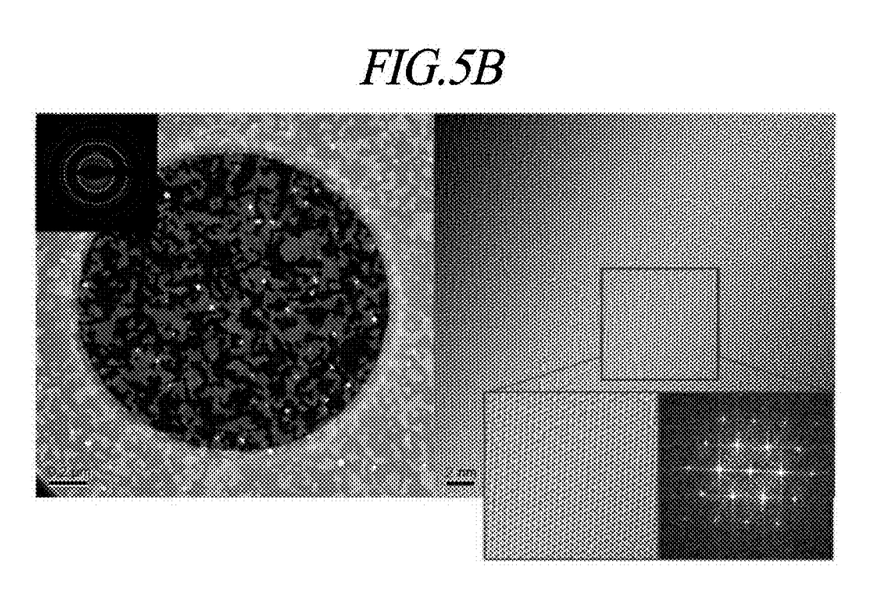

FIG. 5A and FIG. 5B depict examples of a transmission electron microscope (TEM) image illustrating doped metal chalcogenide thin films according to a Comparative Example and an Example of the present disclosure, respectively.

A particle size of doped $MoS_2$ of Comparative Example 2 is limited to several tens of nanometers, as shown in FIG. 5A, due to the metal chalcogenide being grown in all positions on a base material, thereby making it difficult to form large particles when manufacturing the doped metal chalcogenide thin film by the conventional method of depositing the dopant and the metal precursor together. As shown in FIG. 5B, $MoS_2$ particles with a large particle size are formed in doped $MoS_2$ of the Example due to the metal precursor and the chalcogen precursor being grown at partial positions on the base material when manufacturing the doped metal chalcogenide thin film by the method of the present disclosure.

Figure 6:
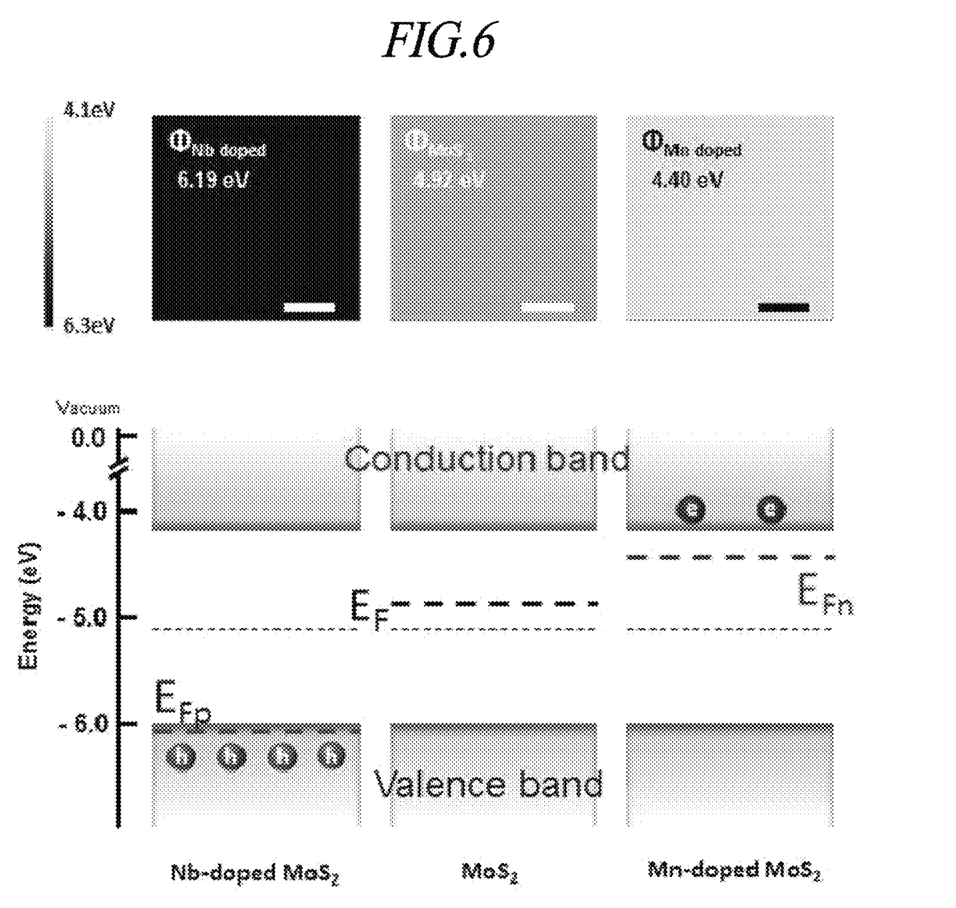
FIG. 6 depicts examples of results (upper side) of measuring work functions of doped metal chalcogenide thin films of a Comparative Example and an Example of the present disclosure using Kevin probe force microscopy (KPFM), and energy band pictures (lower side) corresponding to respective work functions.

FIG. 6 depicts examples of results (upper side) of measuring work functions of doped metal chalcogenide thin films of a Comparative Example and an Example using Kevin probe force microscopy (KPFM), and energy band pictures (lower side) corresponding to respective work functions.

Referring to FIG. 6, a MoS$_2$ thin film doped with Nb in the Example has a high work function of 6.19 eV (left upper), and the work function is shown as an energy band corresponding to P-type (left lower). A MoS$_2$ thin film doped with Mn in the Example has a low work function of 4.40 eV (right upper), and the work function is shown as an energy band corresponding to N-type (right lower). The center is the results of a pure MoS$_2$ thin film according to Comparative Example 1.

Figure 7:
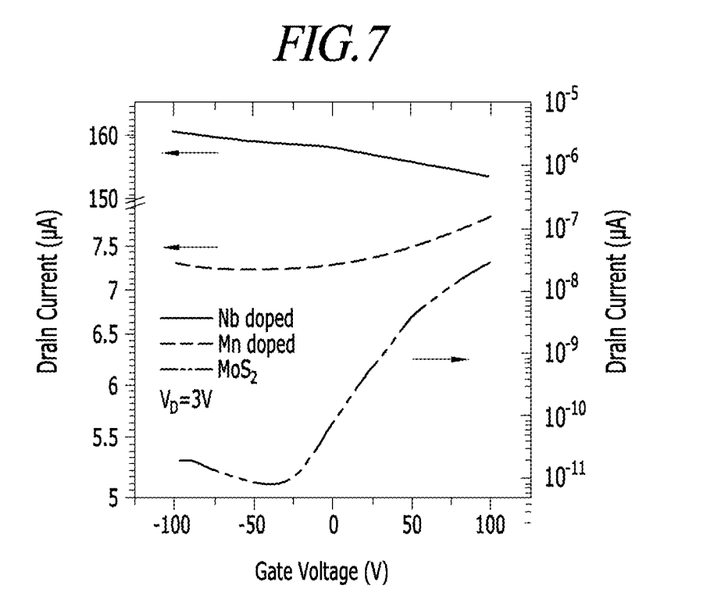
FIG. 7 is a graph illustrating examples of electrical characteristics of doped metal chalcogenide thin films of a Comparative Example and an Example of the present disclosure.

FIG. 7 is a graph illustrating examples of electrical characteristics of doped metal chalcogenide thin films according to Comparative Example and Example.

Referring to FIG. 7, a pure MoS$_2$ thin film of the Comparative Example 1 exhibits N-type semiconductor properties, e.g., a MoS$_2$ thin film doped with Mn in the Example exhibits N-type semiconductor properties of a stronger conductivity, and a MoS$_2$ thin film doped with Nb in the Example exhibits P-type semiconductor properties.

Figure 8A:
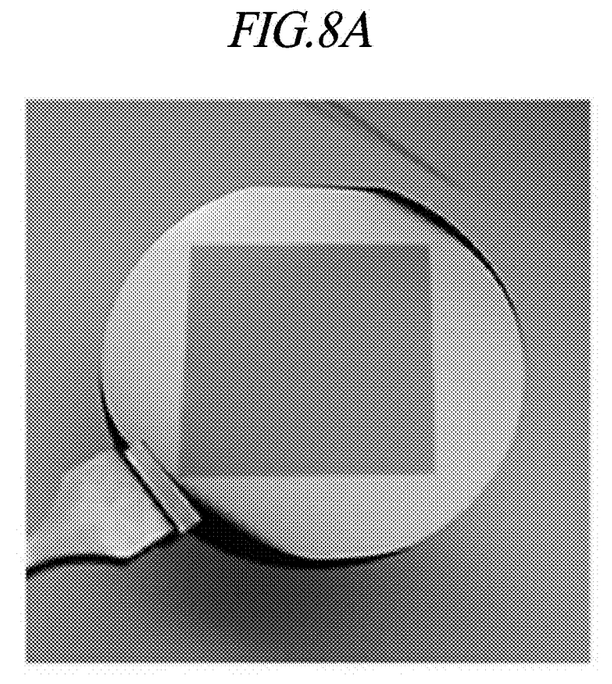
FIG. 8A is an image illustrating an example of a doped metal chalcogenide thin film.
Figure 8B:
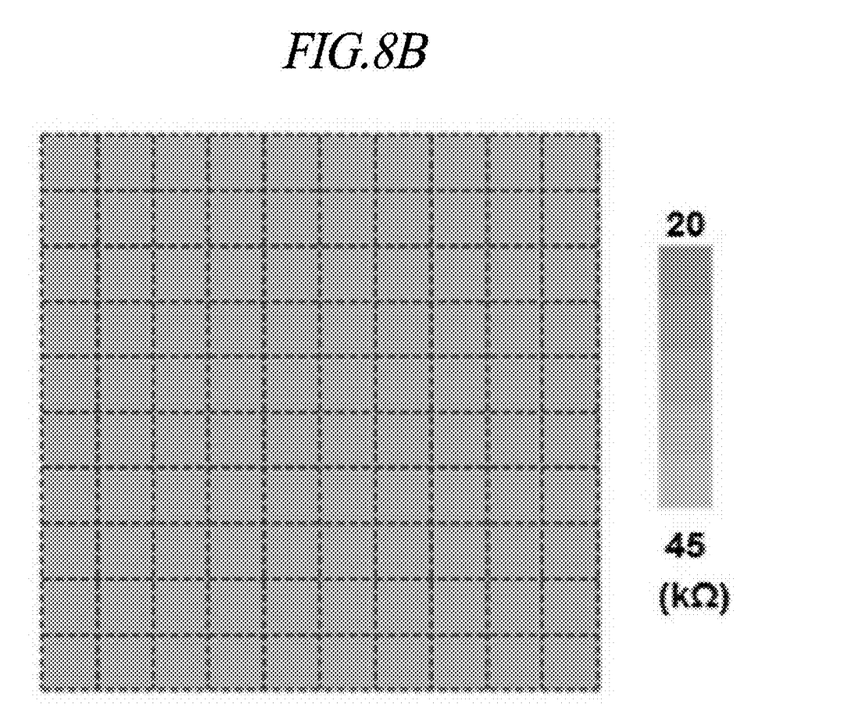
FIG. 8B is an image illustrating an example of conductivity values measured at 100 points on an area of 4 mm×5.3 mm of a doped metal chalcogenide thin film.
Figure 8C:
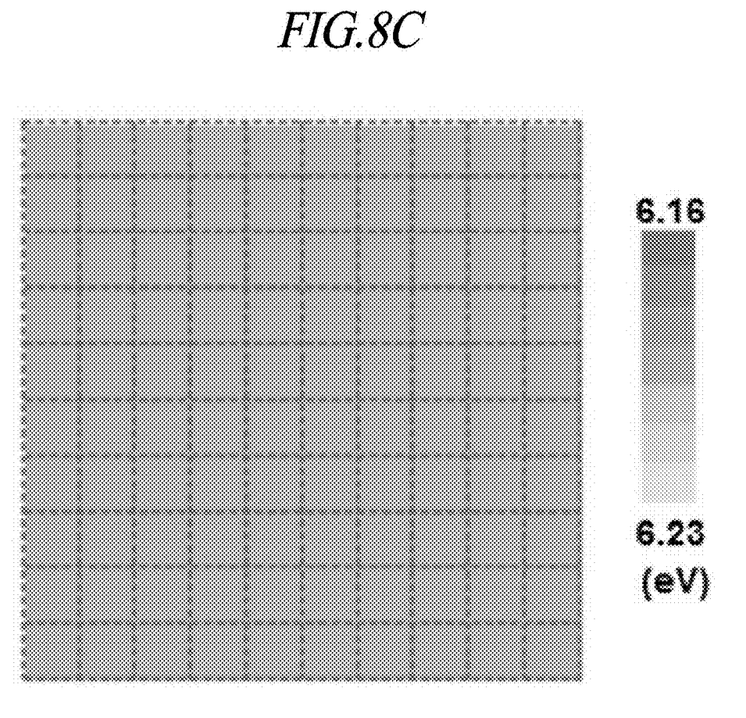
FIG. 8C is an image illustrating an example of work function values measured at 100 points on an area of 4 mm×5.3 mm of a doped metal chalcogenide thin film.

FIG. 8A is an image illustrating an example of a doped metal chalcogenide thin film. FIG. 8B is an image illustrating an example of conductivity values measured at 100 points on an area of 4 mm×5.3 mm of a doped metal chalcogenide thin film. FIG. 8C is an image illustrating an example of work function values measured at 100 points on an area of 4 mm×5.3 mm of a doped metal chalcogenide thin film.

Referring to FIG. 8A to FIG. 8C, uniform conductivity and work function values are measured at 100 points on an area of 4 mm×5.3 mm of a MoS$_2$ thin film of the Example transferred to a two-inch wafer.

Figure 9A:
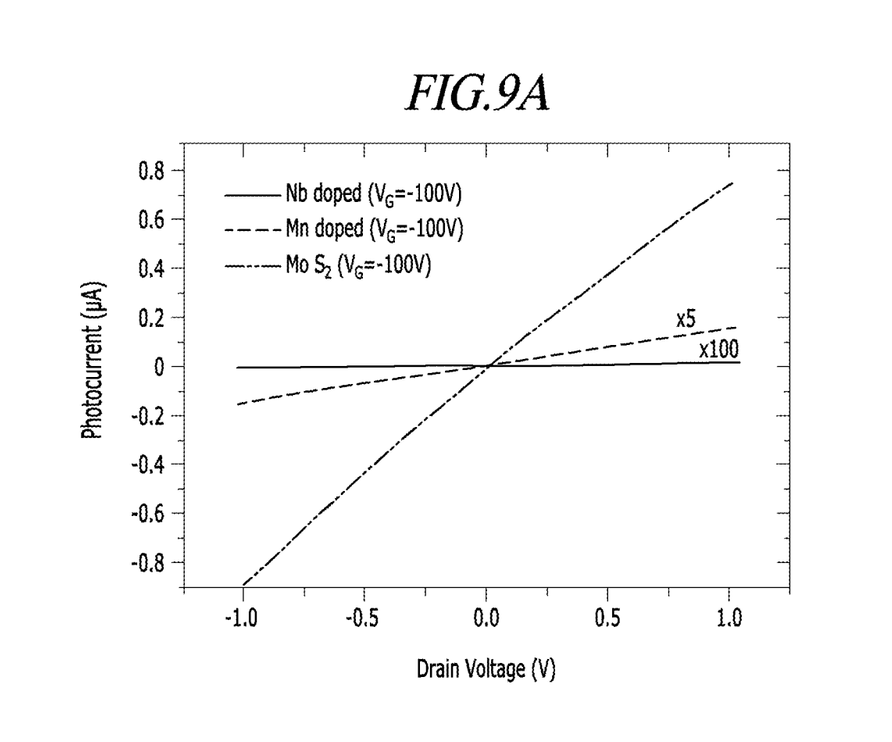
FIG. 9A and FIG. 9B graphs illustrating an example of a photo-generated current of doped metal chalcogenide thin films of a Comparative Example and an Example of the present disclosure, respectively.
Figure 9B:
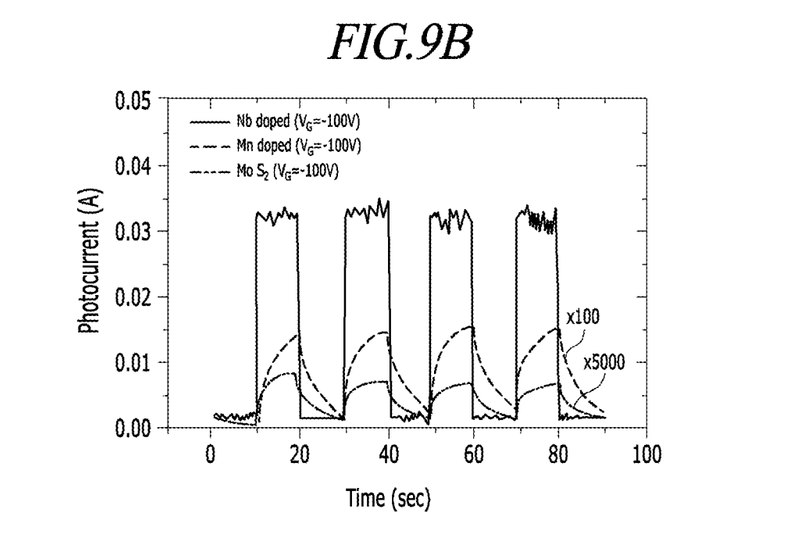

FIG. 9A and FIG. 9B are graphs illustrating an example of a photo-generated current of doped metal chalcogenide thin films according to a Comparative Example and an Example.

Referring to FIG. 9A and FIG. 9B, a doped MoS$_2$ thin film of the Example exhibits a higher photo-generated current than a pure MoS$_2$ thin film of the Comparative Example 1, and a faster response to turning on light or turning off light occurs along with the higher photo-generated current in the doped MoS$_2$ thin film of the Example.

Figure 10A:
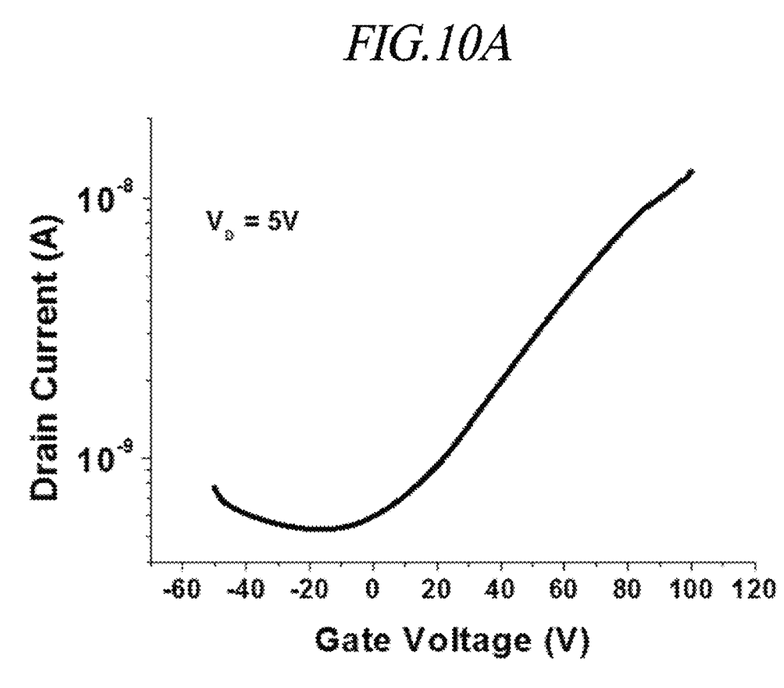
FIG. 10A and FIG. 10B graphs illustrating examples of charge mobilities of doped metal chalcogenide thin films of a Comparative Example and an Example of the present disclosure, respectively.
Figure 10B:
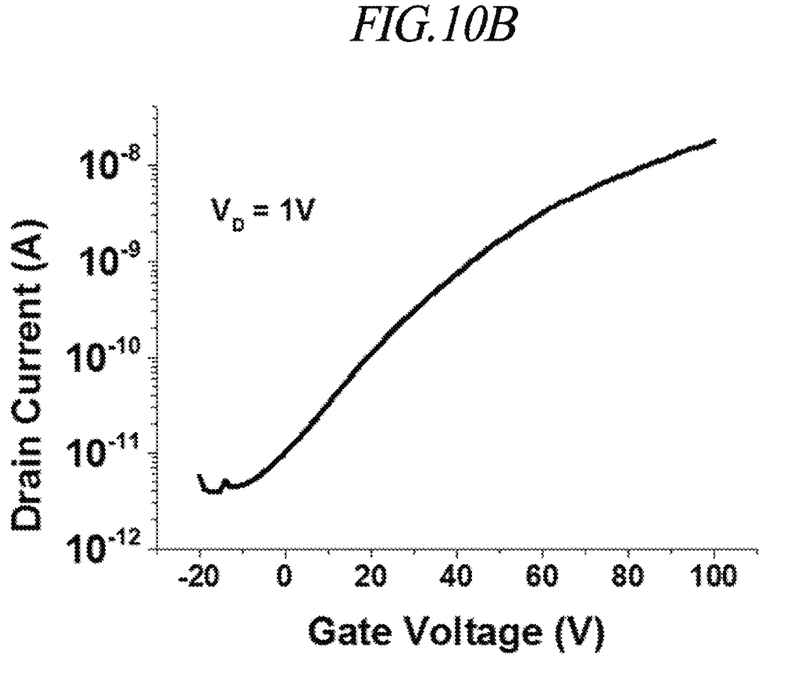

FIG. 10A and FIG. 10B are graphs illustrating examples of charge mobilities of doped metal chalcogenide thin films according to a Comparative Example and an Example.

Referring to FIG. 10A and FIG. 10B, a doped MoS$_2$ thin film of a Comparative Example 2 has a charge mobility of about 7.02×10$^{-4}$ cm$^2$/V·s, and a doped MoS$_2$ thin film of the Example has a charge mobility of about 0.1 cm$^2$/V·s. It can be confirmed that the doped MoS$_2$ thin film of the Example exhibits a similar current amount at a lower voltage than the doped MoS$_2$ thin film of the Comparative Example 2, and the charge mobility of the doped MoS$_2$ thin film of the Example is increased as much as about 140 times compared to the doped MoS$_2$ thin film of the Comparative Example 2.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of manufacturing a doped metal chalcogenide thin film, the method comprising:
depositing a dopant atom on a base material to form a dopant atom-deposited base material; and
forming a doped metal chalcogenide thin film on the dopant atom-deposited base material by supplying heat, a metal precursor and a reaction gas comprising a chalcogen precursor to the dopant atom-deposited base material,
wherein the forming the doped metal chalcogenide thin film comprises continuously performing a first heat treatment process and a second heat treatment process,
wherein the first heat treatment process comprises synthesis of the metal chalcogenide thin film for a predetermined period, and the second heat treatment process comprises increasing crystallinity of the metal chalcogenide thin film, and
wherein the doped metal chalcogenide thin film is synthesized by reacting the metal precursor and the chalcogen precursor on the dopant atom-deposited base material.

2. The method of claim 1, wherein the predetermined period is 20 to 40 minutes.

3. The method of claim 1, wherein the reaction gas is Hydrogen Sulfide.

4. The method of claim 1, wherein the first heat treatment process is performed in a temperature range of 100 to 600° C., and the second heat treatment process is performed in a temperature range of 600 to 900° C.

5. The method of claim 1, wherein the doped metal chalcogenide thin film has a particle size of 100 to 900 nm.

6. The method of claim 1, wherein the doped metal chalcogenide thin film exhibits N-type semiconductor properties or P-type semiconductor properties.

7. The method of claim 1, wherein the dopant atom comprises a material selected from the group consisting of Nb, Mn, Ti, W, Zr, Mg, P, Ni, Al, Sn, V, Re, Ge, Si, B, Ga, In, Sb, Cr, Au, Na, Li, and combinations thereof.

8. The method of claim 1, wherein the depositing the dopant atom on the base material is performed by a method selected from the group consisting of an electron beam evaporation method, a sputtering method, a vacuum deposition method, an ion plating method, a thermal evaporation method, an ion cluster beam method, a pulsed laser deposition method, an atomic layer deposition method, an atomic beam epitaxy method, and combinations thereof.

9. The method of claim 1, wherein the metal precursor comprises a material selected from the group consisting of Mo, W, Bi, Mg, Al, Si, Ca, Sc, Ti, V, Cr, Mn, Fe, Co, Ni, Cu, Zn, Ga, Ge, Sr, Y, Zr, Nb, Tc, Ru, Rh, Pd, Ag, Cd, In, Sn, Sb, Ba, La, Hf, Ta, Re, Os, Ir, Pt, Au, Hg, Tl, Pb, Po, oxides thereof, and combinations thereof.

10. The method of claim 1, wherein the chalcogen precursor comprises a material selected from the group consisting of S, Se, Te, and combinations thereof.

11. The method of claim 1, wherein the base material comprises a material selected from the group consisting of Si, SiO$_2$, Ge, GaN, AlN, GaP, InP, GaAs, SiC, Al$_2$O$_3$, LiAlO$_3$, MgO, glass, quartz, sapphire, graphite, graphene, plastics, polymer, boron nitride (h-BN), and combinations thereof.

12. A doped metal chalcogenide thin film manufactured by the method of claim 1.

13. The doped metal chalcogenide thin film of claim 12, wherein the doped metal chalcogenide thin film has a particle size of 100 to 900 nm.

14. A thin film comprising the doped metal chalcogenide thin film of claim 12.

* * * * *